United States Patent [19]
Baroni et al.

[11] Patent Number: 5,703,821
[45] Date of Patent: *Dec. 30, 1997

[54] HIGH PERFORMANCE SINGLE PORT RAM GENERATOR ARCHITECTURE

[75] Inventors: Andrea Baroni, Viadana; Giovanni Mastrodomenico, Campobasso; Michele Taliercio, Arluno; Piero Capocelli, Milan, all of Italy; Luigi Carro, Porto Alegre, Brazil; Rajamohan Varambally, Karnataka, India

[73] Assignee: SGS-Thomson Microelectronics S.r.l., Agrate Brianza, Italy

[ * ] Notice: The term of this patent shall not extend beyond the expiration date of Pat. No. 5,471,428.

[21] Appl. No.: 562,736
[22] Filed: Nov. 27, 1995

Related U.S. Application Data

[63] Continuation of Ser. No. 159,181, Nov. 30, 1993, Pat. No. 5,471,428.

[30] Foreign Application Priority Data

Nov. 30, 1992 [EP] European Pat. Off. ............ 92830644

[51] Int. Cl.⁶ .................................................. G11C 7/00
[52] U.S. Cl. ........................................ 315/210; 365/204
[58] Field of Search ........................... 365/200, 201, 365/210, 204

[56] References Cited

U.S. PATENT DOCUMENTS

| | | | |
|---|---|---|---|
| 4,339,766 | 7/1982 | Rao | 365/149 |
| 4,849,935 | 7/1989 | Miyazawa | 365/189.05 |
| 4,926,387 | 5/1990 | Madland | 365/233 |
| 4,982,364 | 1/1991 | Iwahastic | 365/210 |
| 5,268,869 | 12/1993 | Ferris et al. | 365/210 |
| 5,471,428 | 11/1995 | Baroni et al. | 365/201 |

FOREIGN PATENT DOCUMENTS

| | | |
|---|---|---|
| A-0383080 | 8/1990 | European Pat. Off. |
| A-0422939 | 4/1991 | European Pat. Off. |

OTHER PUBLICATIONS

IBM Technical Disclosure Bulletin, vol. 31, No. 6, Nov. 1988, New York, US, pp. 128–129, "CMOS High Performance Sense Scheme For Growable Macros".

Tou, Jarvis et al., "A Sub-Micron CMOS Embedded SRAM Compiler", IEEE 1991 Integrated Circuits Conference.

Dao, Tim et al., "A Dual-Port SRAM Compiler for 0.8mm 100K BICMOS Gate Arrays", IEEE 1991 Integrated Circuits Conference.

Primary Examiner—Joseph A. Popek
Attorney, Agent, or Firm—Wolf, Greenfield & Sacks, PC; James H. Morris

[57] ABSTRACT

A single-port RAM generator architecture, for the generation of different RAM structures in a CAD environment, and to test the operation capabilities of the different RAM structure. The architecture includes a Static RAM matrix and a self timed architecture, which includes a control logic, both a dummy row and a dummy column having respectively equivalent load of a word line and of bit column of said matrix. The dummy column is discharged at a faster rate than the corresponding bit column optimizing the timing and reducing power consumption. Different column multiplexer selections provide different RAMs for a selected RAM size, each having slightly different silicon area and timing performance.

39 Claims, 9 Drawing Sheets

HIGH PERFORMANCE SINGLE PORT RAM GENERATOR ARCHITECTURE

This application is a continuation of application Ser. No. 08/159,181, filed Nov. 30, 1993, entitled HIGH PERFORMANCE SINGLE PORT RAM GENERATOR ARCHITECTURE, now U.S. Pat. No. 5,471,428.

BACKGROUND OF THE INVENTION

1. Field of Invention

The field of application of the present invention pertains to the development of memory generators installed and running in Computer Aided Design environments.

This invention relates to a high performance single port RAM generator architecture intended to generate and operate different RAMs structures in a CAD environment. The RAM generator architecture includes a Static RAM matrix and a self timed control logic.

2. Discussion of the Related Art

As it is well known, the technical development in the microelectronics field has allowed the integration of millions of transistors on a single chip.

The problem of how to design such complex integrated circuits, and how to test their operation capabilities, has drawn to a new design methodology and to new design instruments.

From a full custom design approach, that was intended to optimize the silicon area to the detriment of the time spent on the circuit design, the modern approach is now based on the so-called structural design that uses predetermined circuit blocks, each block having known functions and characteristics if taken alone or in combination, Thus, a library containing hundreds of circuitry components is nowadays available for the circuit designer.

As a result, in order to develop library efficiency, integrated circuits generators have been elaborated just to conform the library elements according to the user's necessity.

Therefore, it's not even necessary to expand the library for including all the possible options of a certain circuit. It is sufficient to maintain a base circuit and a suitable program capable to modify the base circuit according to specific requirements.

An example of this technique is given by memory boards built by a basic cell which is repeated for a predetermined number of times in order to obtain a memory structure suitable for a specific application.

In such a manner, the number of words, the word size and the circuit layout may be designed choosing among a range of parameters.

Consequently, this prior art solution requires a circuit generator library containing all possible basic circuits covering all possible user's requirements.

Therefore, the complexity of the basic circuits in of the circuit generator library is the critical point of the prior art solution.

Each basic circuit included in the circuit generator library should be useful to tolerate any possible parameters modification introduced by the user offering substantially a self adapting disposition.

A first object of the present invention is to provide a single-port RAM generator having such structural and functional features as to afford variations in the parameters introduced by the user, thereby to overcome the drawbacks of prior art solutions.

A further object of the present invention is to provide a RAM generator containing all the elements to use the same basic generation cell with a self timing architecture to generate internal signals to perform RAM operation. Timing must change automatically if different RAM sizes are employed to achieve high speed, and low power consumption, even with smaller memory cells.

SUMMARY OF THE INVENTION

According to the present invention, a single-port RAM generator, in a CAD environment, generates different RAM structures. The generated RAM structure has a static RAM (SRAM) matrix and a self-timed control architecture.

The SRAM matrix has at least one row which corresponds to a word line and at least one column which corresponds to a bit line. The self-timed control architecture has a dummy row which has an equivalent load of a word line in the SRAM matrix and corresponds to a row in the SRAM matrix; and a dummy column which has the equivalent load of a bit line in the SRAM matrix and corresponds to a column in the SRAM matrix. Discharge cells are in the input portion of the dummy column and they enable the dummy column to be discharged at a faster rate than the corresponding bit column in the SRAM matrix.

Preferably, the structure of the basic SRAM cells of the SRAM matrix is a couple of small inverters latches connected back to back with corresponding pass transistors connected to the bit line of the SRAM matrix. The structure of the discharge cells is a couple of transistors, of the MOS type, both connected between the dummy column and ground. The drain of the first transistor is connected to the dummy column and the source of the first transistor is connected to the drain of the second transistor. The source of the second transistor is connected to ground and the gate of the first transistor connected to the supply voltage. All gate terminals of first transistors are connected together and receive a same dummy row selection signal. The structural and functional features of SRAM matrix and the self-timed control architecture allows variations in parameters introduced by the user in a CAD environment.

In a preferred embodiment of the RAM structure for RAM operations, a control logic, with control logic inputs of a clock signal and a write enable signal, is an additional element of the self-timed control architecture. The control logic has a duty cycle independent read cycle activated by the falling edge of the clock signal, with the output of the control logic having an output connected to the dummy row. Also, the output of the generated RAM structure can be enabled by an output enable signal or enabled by both the output enable signal and the clock signal.

The feature and advantages of an architecture according to the present invention will become apparent from the following detailed description of an embodiment thereof, given by way of illustration and not of limitation with reference to the accompanying drawings.

DETAILED DESCRIPTION

Figure 1:
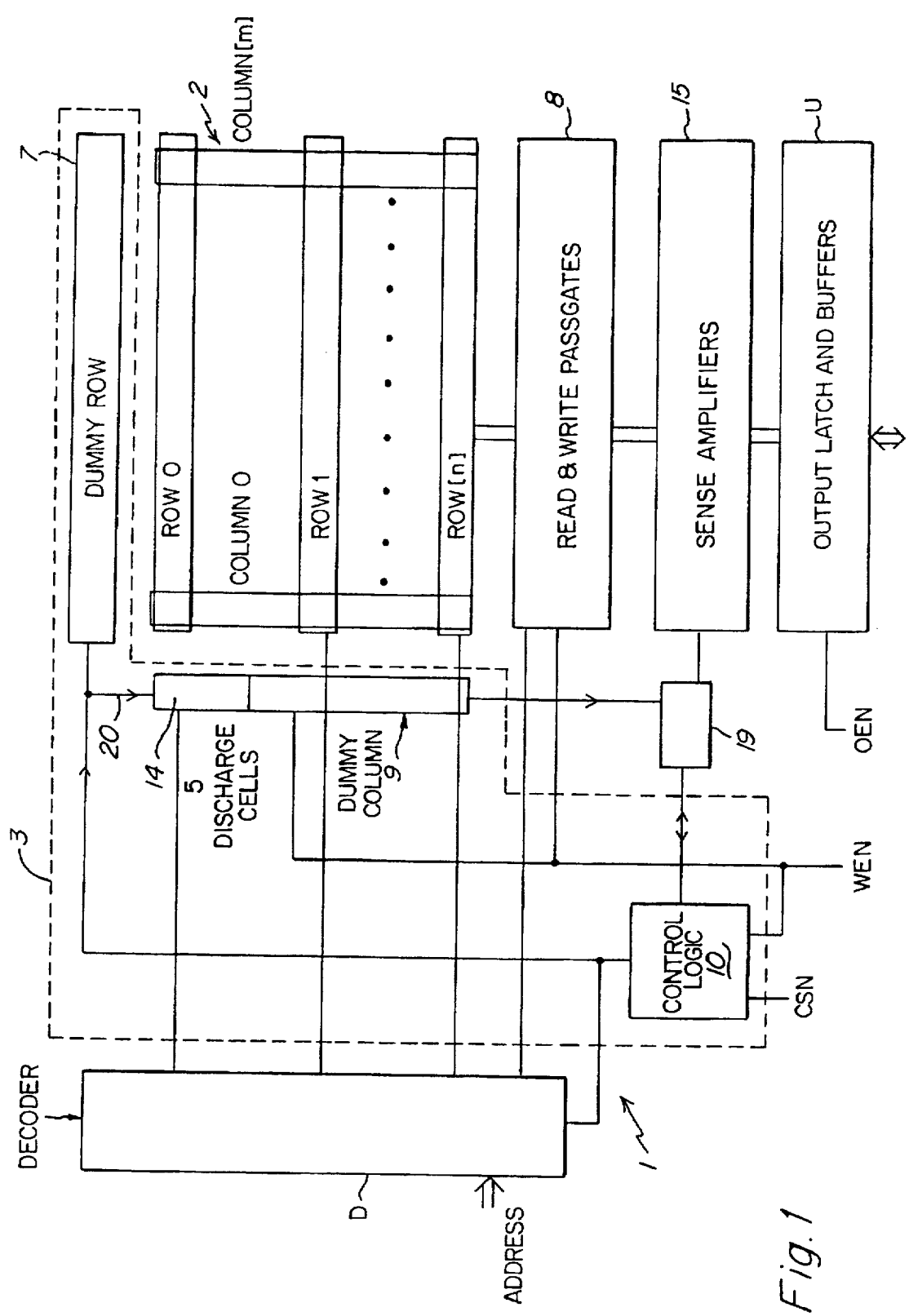
FIG. 1 is a schematic view of a single-port RAM generator architecture embodying the present invention.

Generally and schematically shown at 1 in the drawing is the architecture of a single-port RAM generator embodying the present invention.

The RAM generator 1 is intended to generate different RAMs structures depending on the user's specific requirements. The generator is preferably realized in HCMOS technology.

Generator 1 operates in a CAD system environment, not shown being of a conventional type known as UNIGEN. A wide range of parameters are available to generate the RAM structure: i.e. from 8 to 8k words with a word size of 1 to 64 bits. Moreover, two modes of RAM can be generated as hereinafter described.

Generator 1 comprises Static RAM matrix 2 and a self timed architecture 3.

SRAM matrix 2 comprises a predetermined number of rows corresponding to the word lines and a predetermined number of columns corresponding to the bit lines.

Each basic SRAM cell 13 comprises a couple of small inverters 4, 5 latches connected back to back with corresponding pass transistors M4, M5 connected to the bit line.

Figure 2:
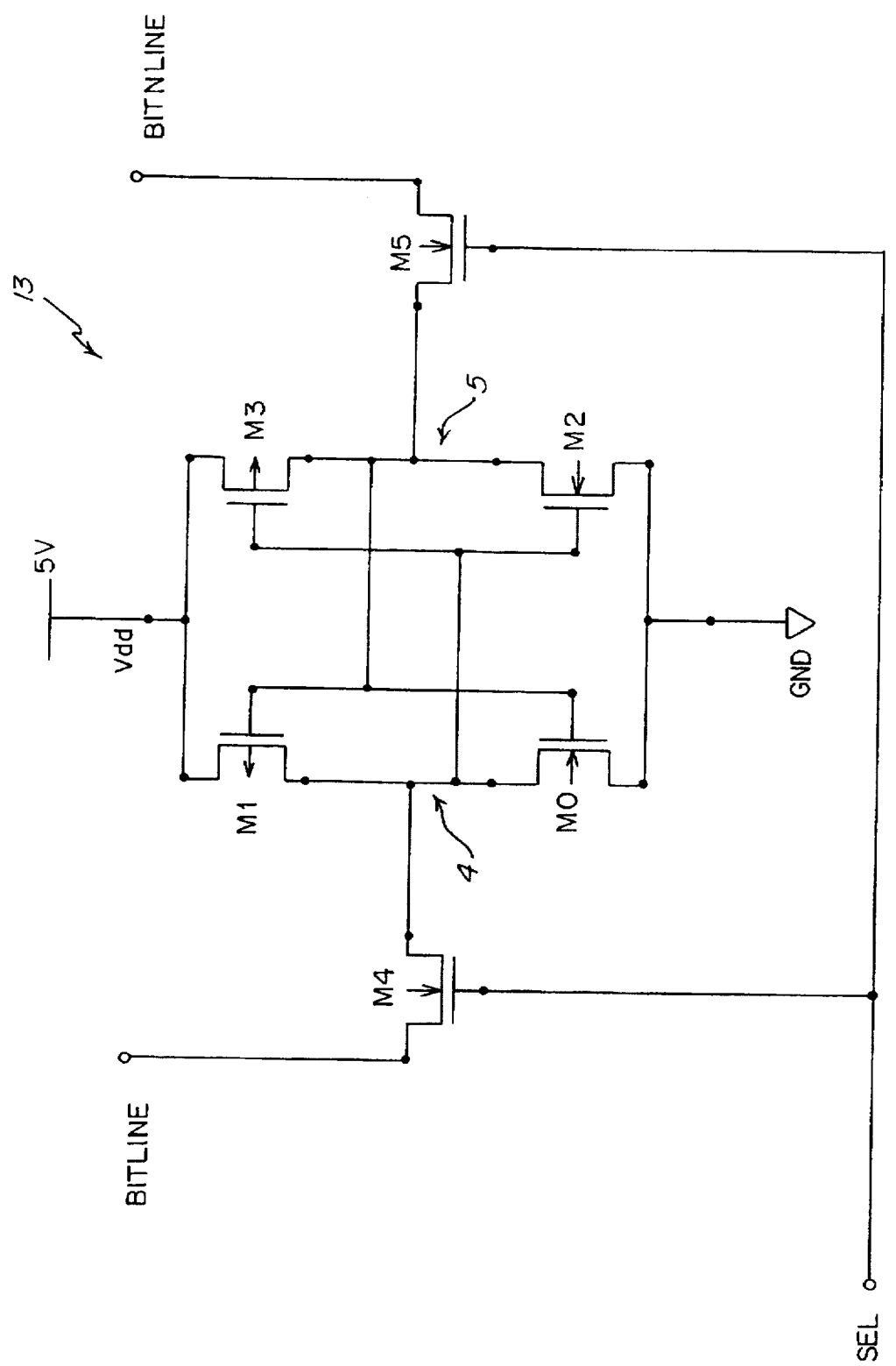
FIG. 2 is a schematic view of a basic SRAM cell included in the generator of FIG. 1.

Each inverter 4, 5 is connected between reference voltage and a supply voltage Vd comprising a CMOS structure with a first N-channel MOS transistor connected to a second P-channel MOS transistor. In FIG. 2 is schematically shown the cell 13 structure with transistors M0 and M1 forming the first inverter 4 and transistors M2 and M3 forming the second inverter 5.

More specifically, at least a total of six transistors is included in the basic RAM cell 13 with the inverter latches 4, 5 and two pass transistors M4, M5 connecting to the bit lines. Static power consumption is limited to only leakage current.

Both pass transistors M4, M5 and the inverters 4, 5 are of a small size in order to achieve high density. Self timed architecture 3 comprises a control logic 10, with a duty cycle independent read cycle activated by the falling edge of a clock signal, a dummy row 7 and a dummy column 9.

Dummy row 7 has the equivalent load of a word line. Therefore, dummy row 7 corresponds to a memory row.

Dummy column 9 has the equivalent load of a bit line. Therefore, dummy column 9 corresponds to a memory column.

Dummy row 7 gets selected along with a memory row, while dummy column 9 is selected along with the memory cells but is discharged at a faster rate than the memory column.

Dummy column 9 comprises an input portion with an array 11 of discharge cells whose function will be described hereinafter.

Both dummy row 7 and dummy column 9 give equivalent loading to the control circuitry in order to generate signal which are always optimum.

Figure 3:
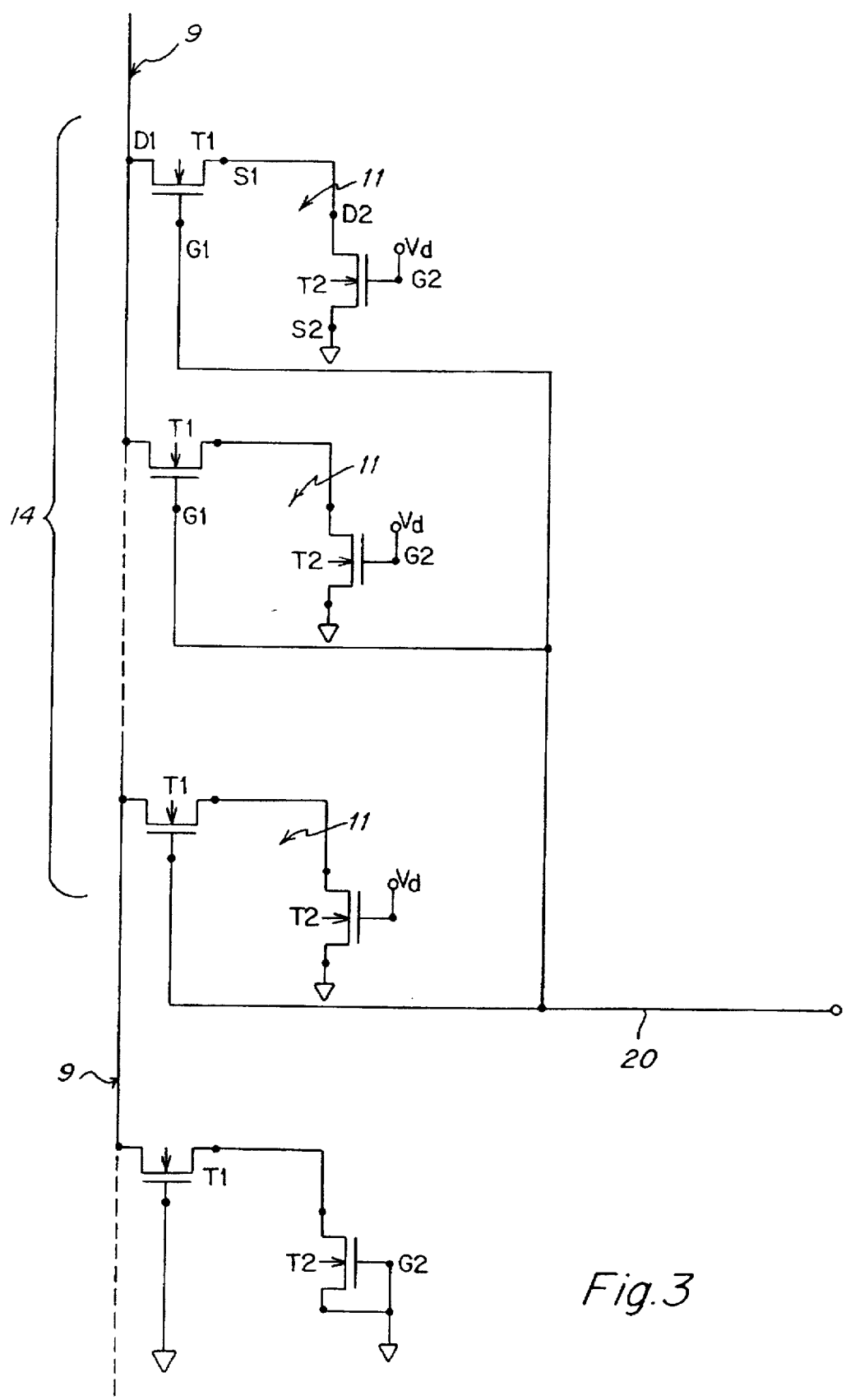
FIG. 3 shows a schematic view of a particular of the RAM generator architecture of FIG. 1.

FIG. 3 shows the basic structure of dummy column 9 input portion 14. Such input portion 14 comprises some discharge cells 11 each including a couple of transistors T1, T2.

Both transistors T1, T2 are N-channel MOS and are connected between dummy column 9 and the supply voltage Vd. Moreover, the size of transistors T1 and T2 is equivalent to the size of transistors M4 and M0 respectively.

Each first transistor T1 has the drain D1 connected to the bit line and the source S1 coupled to the drain D2 of the second transistor Each second transistor T2 has the source S2 connected to ground and the gate G2 connected to the supply voltage Vd.

All gate terminals G1 of first transistors T1 are connected together and receive a same dummy row selection signal 20. This signal 20 is produced at the output of control logic 10.

At least five discharge cells 11 are parallelly connected to dummy column 9.

The remaining cells of dummy column 9 are similar in structure to discharge cells 11 with the only difference that the gate terminal G2 of each second transistor T2 is connected to the reference voltage.

Coming back to the generator main structure, a read and write passgates block 8 is connected to bit lines after the last row line of the memory matrix 2. A sense amplifier 15 is downstream connected to the passgate block 8 and gives access to an output line U of latches and buffers. The output line U is tristated by an output enable pin OEN.

A decoder D is provided to select the addresses of the memory matrix 2, as shown in FIG. 1. According to known technology, the size of decoder D is adapted to the RAM size.

Sense amplifiers 15 are driven by dummy column 9 and control logic 10 through a driver block 19. The control logic 10 is also connected to dummy row 7, to feed the selection signal 20, and to the decoder D. Control logic inputs are: a clock signal CSN and a write enable signal WEN.

The system clock CSN is a free running clock and is used to trigger the RAM access with its falling edge.

Write enable signal WEN decides the cycle to be either write or read.

The operation mode of the single-port SRAM generator of the present invention is hereinafter described with reference to an initial state in which a read cycle is ready to run.

A read cycle starts with the falling edge of the clock signal CSN. Reading is duty cycle independent but writing takes place when write enable signal WEN is held low.

Address is latched and the decoder D selects the memory cells of the matrix 2.

Dummy column 9 is discharged at a faster rate, about five times, than normal bit lines. In other words, dummy column gets discharged faster than the memory column.

Dummy column 9 goes below half the supply voltage and activates the sense amplifier 15, that strongly increases the voltage difference between bit lines. When sense amplifiers are selected, memory cells are unselected.

At this point, memory columns have only 300 mV voltage difference, unlike in other conventional RAMs where voltage difference is higher.

Data is therefore latched and becomes available at the output line U. More particularly, output columns are connected to the memory columns through high resistance making only output columns getting discharged to zero whereas the memory column gets discharged minimally to reduce power consumption.

This also reduces precharging time.

Self timed operation optimizes the timing and reduces the power consumption; in fact, a simple sense amplifies, triggered only for the required duration, consumes very little power and gives reasonably fast performance.

Every cycle begins with a read cycle. Read operation starts in every cycle according to the waveform shown in FIG. 4; however, the writing phase is enabled only when WEN (Write ENable) signal is held low, while clock CSN is still low.

If write enable signal WEN goes low, read operation is terminated by putting off the sense amplifier 15, if it is on. Write operation is traditional and takes lesser time than read operation. Input data is put on the bit lines to write into the memory cells 2. During write cycle, input data being written appear at the output bus.

At the occurrence of WEN signal or clock CSN signal going high, the write operation is completed. Bit lines will be precharged and the RAM will be ready for a next cycle.

In every cycle the addresses are latched at the falling edge of the clock (CSN) signal.

The setup and hold times of address and data-in changes depending on the size and mux used for a given RAM. Similarly the access time, write recovery time depends on the size of the RAM.

Data are available at the output line U after the lapse of the access time.

The maximum advantage of the RAM generator of the present invention can be obtained when a wide range of parameters options are available. This allows the user to generate a RAM of optimum performance with minimum compromises.

User can generate the datasheet for different RAMs, and decide the configuration before the generation of a layout view. Different mux choices are available and this implies modification of aspect ratio. Two modes of RAMs can be generated depending on the output control to be CSN dependent.

A) First Mode:

This first mode generates a RAM with the output U enabled only by the output enable signal (OEN). If OEN is high, output bus is tristated.

Read operation starts in every cycle according to the waveforms showed in FIG. 2.

Writing is enabled by signal WEN going to zero during a cycle. The write cycle waveforms are showed in FIG. 3.

Write cycle closes when WEN or CSN signals goes high, whichever comes first.

User can connect the OEN pin to ground to obtain a direct output.

Figure 4:
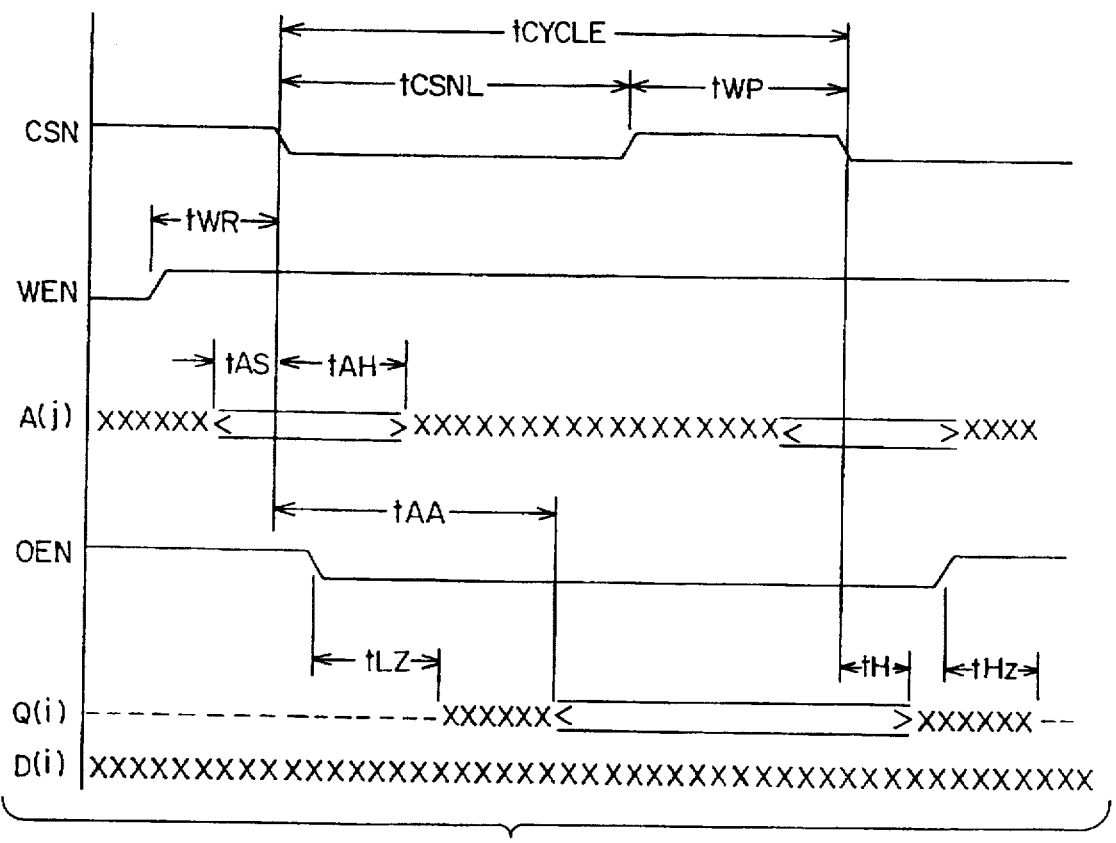
FIGS. 4 to 6 are diagram views showing timing signals waveforms of the generator of the present invention.

If reading is already finished, then the write cycle can be called as a read-modify-write cycle (FIG. 4).

Figure 5:
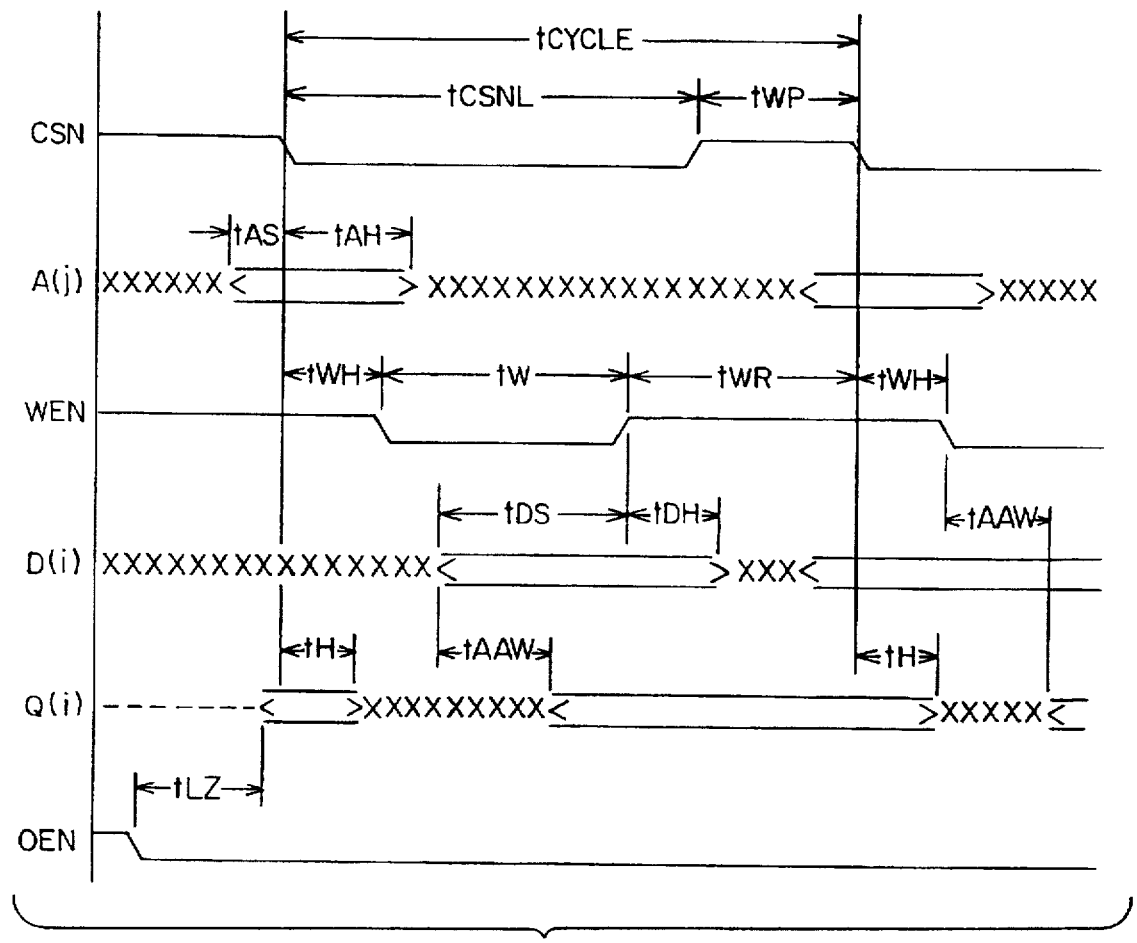

B) Second Mode:

A second operation mode enables the output U only when both clock signal (CSN) and output enable signal (OEN) are held low. The read cycle signals waveforms concerning this second mode are shown in FIG. 5.

When the RAM is generated in this second mode it will have output U controlled by the clock CSN and OEN signal inputs.

Write cycle starts after CSN goes low followed by WEN going low.

On the contrary, when any one of these two signals go high, write cycle is closed.

In other words, either CSN or WEN goes high first, it makes the write cycle to end.

Read cycle starts with the falling edge of the clock CSN and it is always independent from the duty cycle, as shown in FIG. 5.

Figure 6:
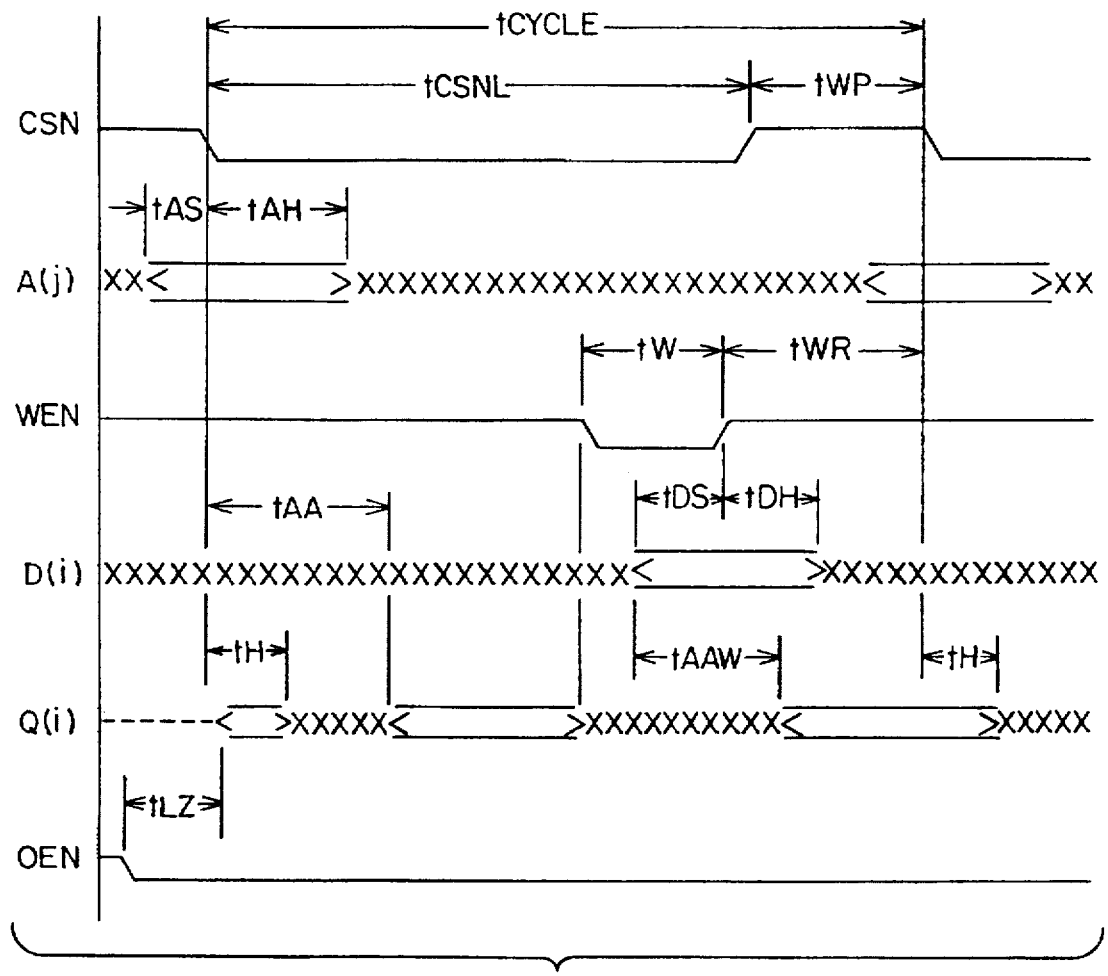

Read operation can be overridden by WEN signal to start write operation. The waveforms of the write cycle are showed in FIG. 6.

It may happen that the user waits for the read operation to be completed before starting writing during the same clock cycle. In this case, it's possible to have a read-modify-write cycle by which output U can be tristated with the help of OEN signal when write operation starts.

However, if both OEN and CSN signals are still low, write operation can overwrite the output data with the data being written.

Figure 7:
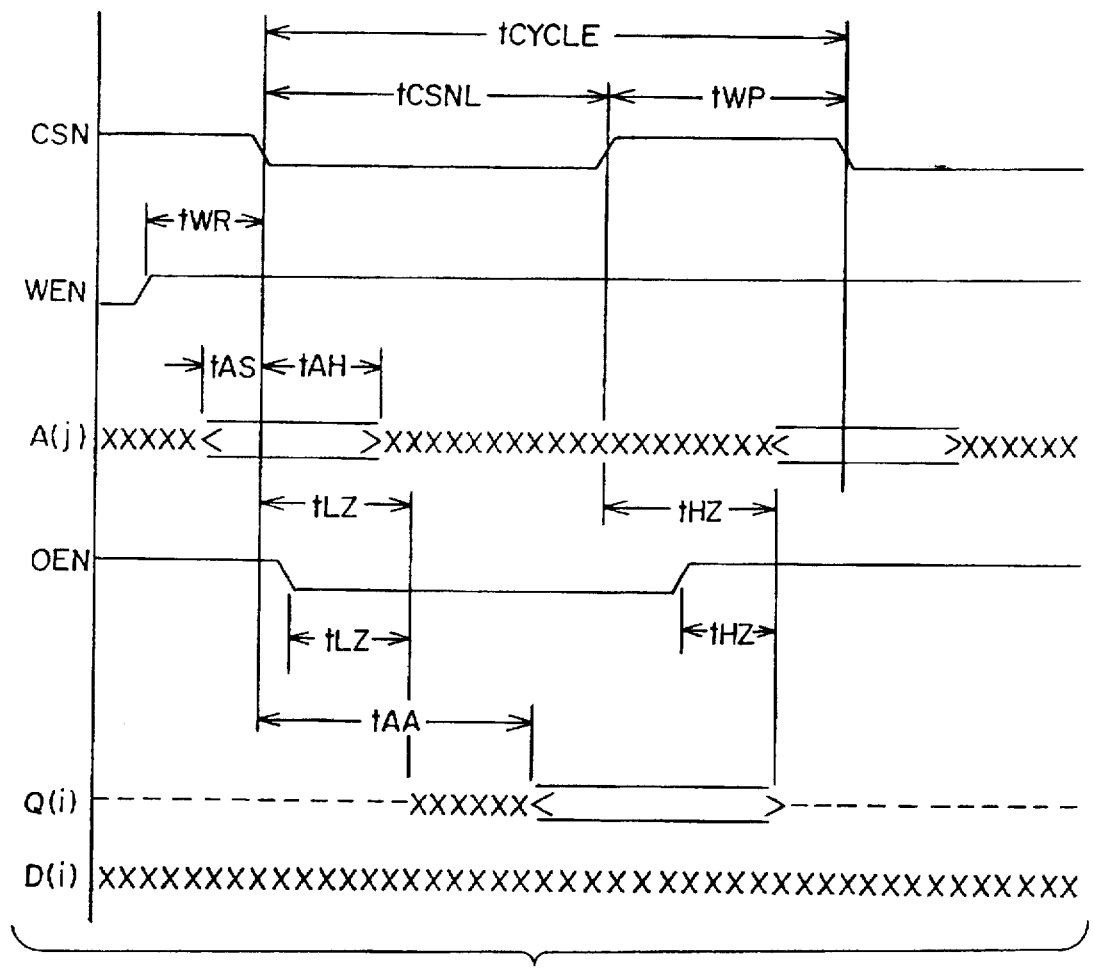
FIGS. 7 to 9 are diagram views showing timing signals waveforms of a slightly different RAM architecture generated by the device of the present invention.
Figure 8:
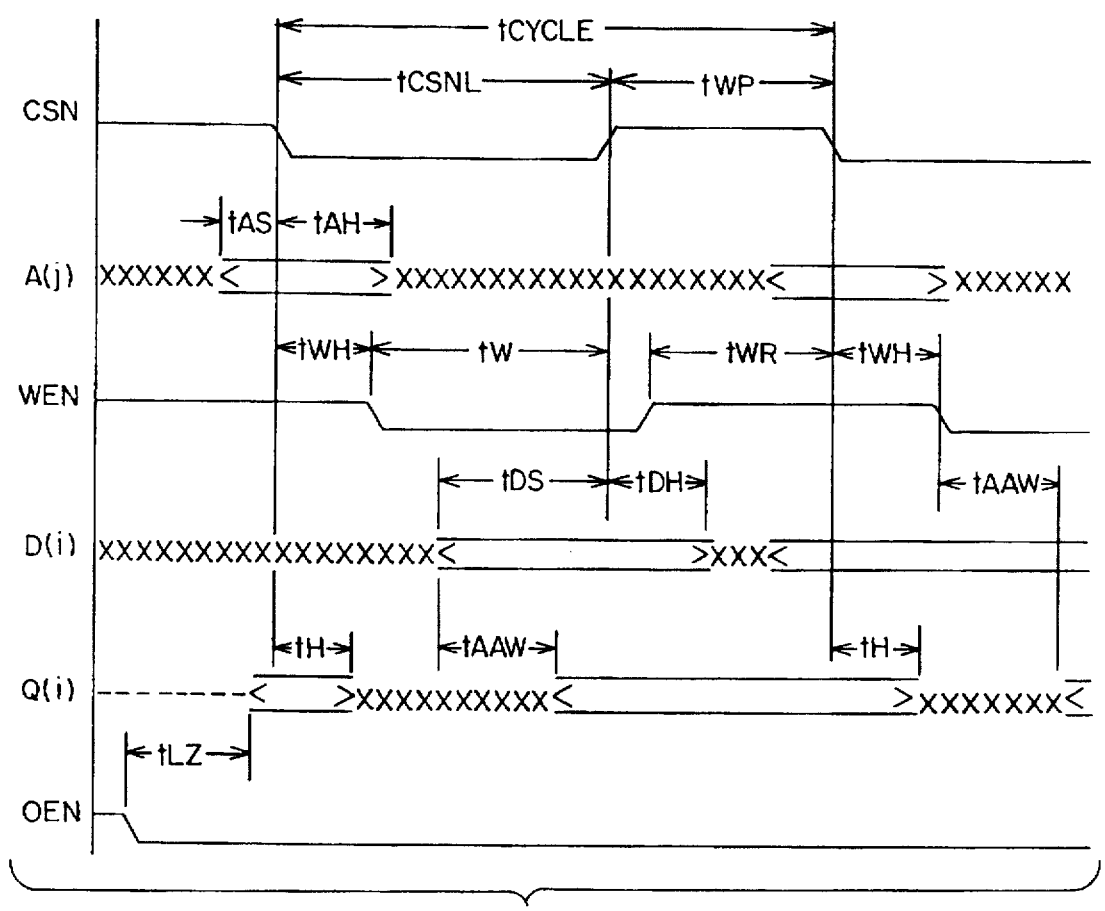
Figure 9:
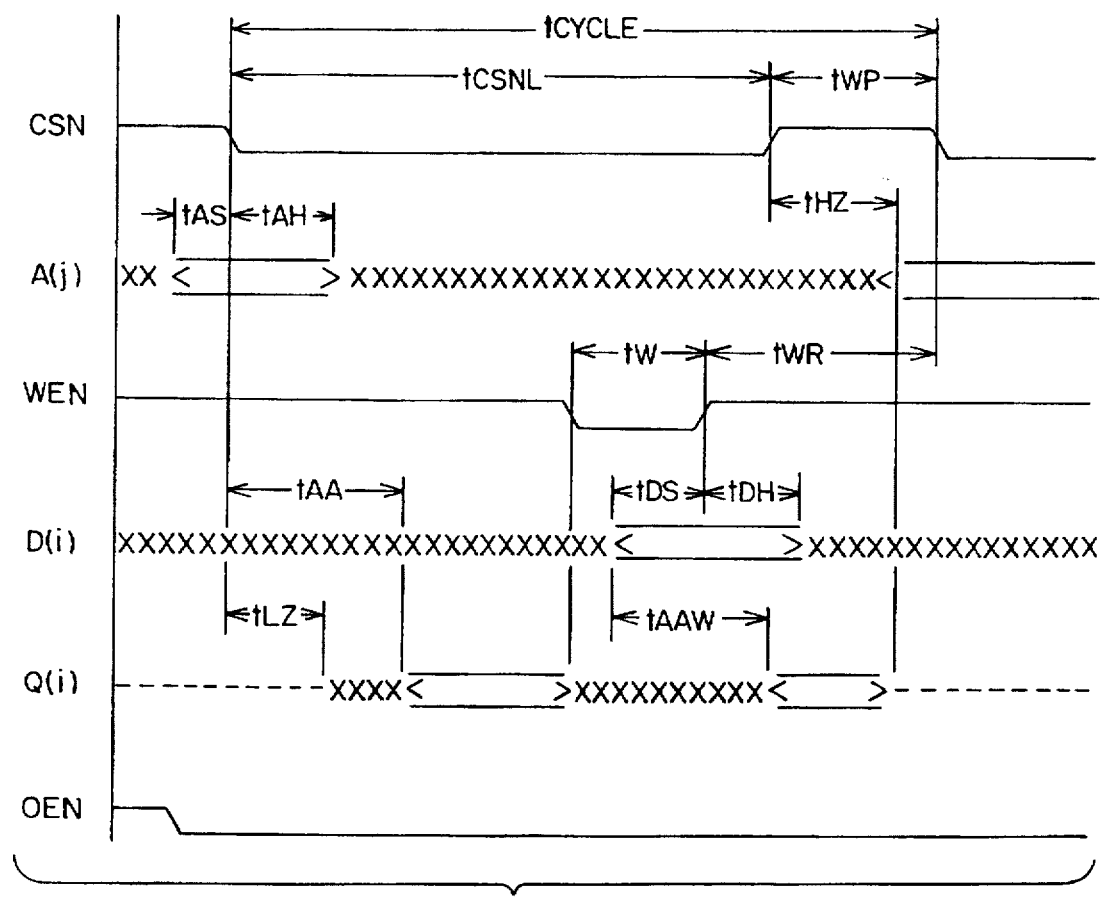

For this specific occurrence reference is made to the waveforms showed in FIG. 7.

User can generate the final layout once he is satisfied with the timing, size, aspect ratio and maximum power consumption of the RAM. Different column multiplexer selections provides different RAMs for a selected RAM size, each having slightly different silicon area and timing performance.

Final layout and views are generated by a suitable program available in the CAD environment.

Having thus described one particular embodiment of the invention, various alteration, modifications, and improvements will readily occur to those skilled in the art.

Such alteration, modifications, and improvements as are made obvious by this disclosure are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A memory device comprising:
   a static RAM matrix; and
   a self timed architecture, wherein the self timed architecture comprises a dummy row and a dummy column having, respectively, an equivalent load of a word line and of a bit column of said matrix, said dummy column being discharged at a faster rate than a corresponding bit column.

2. The memory device of claim 1, wherein said dummy row has an equivalent load of a word line and corresponds to a row of said memory matrix.

3. The memory device of claim 1, wherein said dummy column has an equivalent load of a bit line and corresponds to a column of said memory matrix.

4. The memory device of claim 1, wherein said dummy column comprises an input portion with an array of discharge cells.

5. The memory device of claim 4, wherein each discharge cell of the array of discharge cells includes at least two transistors, each of which is connected between a dummy column and ground.

6. The memory device of claim 5, wherein said at least two transistors are MOS type, with a first transistor having a drain connected to the dummy column and a source coupled to a drain of the second transistor, and a second transistor having a source connected to ground and a gate connected to the supply voltage.

7. The memory device of claim 5, wherein all gate terminals of the first transistors are connected together and receive a same dummy row selection signal.

8. The memory device of claim 1, wherein said static RAM matrix comprises basic SRAM cells including a plurality of inverter latches connected back to back with corresponding pass transistors connected to the bit line.

9. The memory device of claim 1, wherein the self timed architecture further include a control logic with a duty cycle independent read cycle activated by a falling edge of a clock signal, such control logic having an output connected to a dummy row.

10. The memory device of claim 1, further comprising an output line of latches and buffers being enabled by a falling edge of at least one of a clock signal and an output enable signal.

11. A single-port random-access memory comprising:
a decoder;
a read and write passgate;
a sense amplifier;
an output latch and buffer;
a static RAM matrix including at least one row connected to the decoder, and at least one column connected to the read and write passgate, the sense amplifier, and the output latch and buffer; and
a self-timed control-logic, connected to the decoder and further connected to the sense amplifier of the matrix by a driver block, including a dummy row and dummy column.

12. The single port random-access memory of claim 11 wherein each row of the rows and each column of the column of the matrix comprise SRAM cells including a plurality of inverters connected to pass transistors which are connected to corresponding bit lines of the matrix.

13. The single port random-access memory of claim 12 wherein the plurality of inverters comprise connections between a reference voltage and a supply voltage of a CMOS structure with a first N-channel MOS transistor connected to a second P-channel MOS transistor.

14. The single port random-access memory of claim 11 wherein the dummy row provides equivalent loading of a word line to the self-timed control-logic and corresponds to a row of the matrix.

15. The single port random-access memory of claim 11 wherein the dummy column provides equivalent loading of a bit line of the bit lines to the self-timed control-logic and corresponds to a column of the columns in the matrix.

16. The single port random-access memory of claim 15 wherein the dummy column includes an array of discharge cells for a means of discharging the dummy column at a rate faster than the corresponding column of the matrix.

17. The single port random-access memory of claim 16 wherein the discharge cells include a plurality of transistors, each of which is connected to the dummy column and the reference voltage.

18. The single port random-access memory of claim 17 wherein the plurality of transistors are each of a MOS type, with a drain of a first transistor connected to the dummy column, a source of the first transistor connected to a drain of the second transistor, a source of a second transistor connected to the reference voltage and a gate of the second transistor connected to the supply voltage.

19. The single port random-access memory of claim 17 wherein the gate of all of the first transistors are connected together for a means of receiving a same dummy row selection signal.

20. The single port random-access memory of claim 11 wherein the self-timed control includes a duty cycle independent read cycle activated by a falling edge of a clock signal and an output connected to the dummy row.

21. The single port random-access memory of claim 11 wherein the output latch and buffer includes an output line enabled by a falling edge of a clock signal and an output enable signal.

22. A method for operating a random access memory, comprising the steps of:
selecting one of a plurality of memory cells within a memory matrix having rows and columns, the one of the plurality of memory cells providing an output;
selecting a dummy column that has a substantially equivalent load of a column of the matrix, to discharge the dummy column; and
latching the output of the one of the plurality of memory cells in response to the discharge of the dummy column.

23. The method of claim 22, wherein the step of selecting the dummy cell includes controlling the dummy cell to discharge at a rate that is faster than a rate of a corresponding bit column of the memory matrix.

24. The method of claim 22, wherein the step of selecting the dummy column includes activating an array of discharge cells.

25. The method of claim 22, wherein the step of selecting the dummy column includes discharging a plurality of transistors, each of which is connected between the dummy column and a reference voltage.

26. The method of claim 25, wherein each of the plurality of transistors is of a MOS type, with a first transistor of the plurality of transistors having a drain connected to the dummy column and a source coupled to the drain of a second transistor of the plurality of transistors, the second transistor having a source connected to ground and a gate connected to the reference voltage.

27. The method of claim 25, wherein the gate of each first transistor receives a same dummy row selection signal.

28. The method of claim 22, wherein the step of selecting the dummy column includes activating a duty cycle that is independent of a read cycle, in response to a falling edge of a clock signal.

29. The method of claim 22, wherein the step of latching includes selecting an output amplifier and de-selecting the one of the plurality of memory cells.

30. The method of claim 22, wherein the step of latching is performed in response to a discharge of the dummy column of substantially half of a supply voltage that supplies the dummy column.

31. An apparatus for operating a random access memory, comprising:
means for selecting one of a plurality of memory cells within a memory matrix having rows and columns, the one of the plurality of memory cells providing an output;
means for selecting a dummy column that has a substantially equivalent load of a column of the matrix, to discharge the dummy column; and
means for latching the output of the one of the plurality of memory cells in response to the discharge of the dummy column.

32. The apparatus of claim 31, wherein the means for selecting the dummy column includes means for controlling the dummy cell to discharge at a rate that is faster than a rate of a corresponding bit column of the memory matrix.

33. The apparatus of claim 31, wherein the means for selecting the dummy column includes means for activating an array of discharge cells.

34. The apparatus of claim 31, wherein the means for selecting the dummy column includes means for discharging a plurality of transistors, each of which is connected between the dummy column and a reference voltage.

35. The apparatus of claim 34, whereto each of the plurality of transistors is of a MOS type, with a first transistor of the plurality of transistors having a drain connected to the dummy column and a source coupled to the drain of second transistor of the plurality of transistors, the second transistor having a source connected to ground and a gate connected to the reference voltage.

36. The apparatus of claim 35, wherein the gate each first transistor receives a same dummy row selection signal.

37. The apparatus of claim 31, wherein the means for selecting the dummy column includes means for activating a duty cycle that is independent of a read cycle, in response to a falling edge of a clock signal.

38. The apparatus of claim 31, wherein the means for latching includes means for selecting an output amplifier and for de-selecting the one of the plurality of memory cells.

39. The apparatus of claim 31, wherein the means for latching is responsive to a discharge of the dummy column of substantially half of a supply voltage that supplies the dummy column.

* * * * *